United States Patent [19]
Dautremont, Jr. et al.

[11] 3,991,409
[45] Nov. 9, 1976

[54] DIGITAL STORAGE SYSTEM FOR HIGH FREQUENCY SIGNALS

[75] Inventors: Joseph L. Dautremont, Jr., Northridge; William J. Schneider, Glendale, both of Calif.

[73] Assignee: Whittaker Corporation, Los Angeles, Calif.

[22] Filed: Jan. 14, 1975

[21] Appl. No.: 540,859

Related U.S. Application Data

[63] Continuation-in-part of Ser. No. 474,245, May 29, 1974.

[52] U.S. Cl. .................. 340/173 R; 340/173 RC
[51] Int. Cl.² ........................................ G11C 13/00
[58] Field of Search .................. 340/173 R, 173 RC

[56] References Cited
UNITED STATES PATENTS
3,388,377  6/1968  Folsom ........................ 340/173 R Primary Examiner—Terrell W. Fears
Attorney, Agent, or Firm—Henry M. Bissell

[57] ABSTRACT

A system and a method are provided for storing high frequency signals, for example microwave signals, for later reproduction with any desired degree of fidelity. The system and method involve determining a measure of the phase difference between an incoming high frequency signal and a converting signal. The measure of the phase difference consists of a plurality of signals which may change rapidly. The phase difference signals are converted to digital frequencies and may be stored or transmitted in that form. Later, the digital signals may be converted to analog signals (if necessary) and used to control the phase of a signal having the frequency of the converting signal. This process reconstructs the incoming high frequency signal.

11 Claims, 22 Drawing Figures

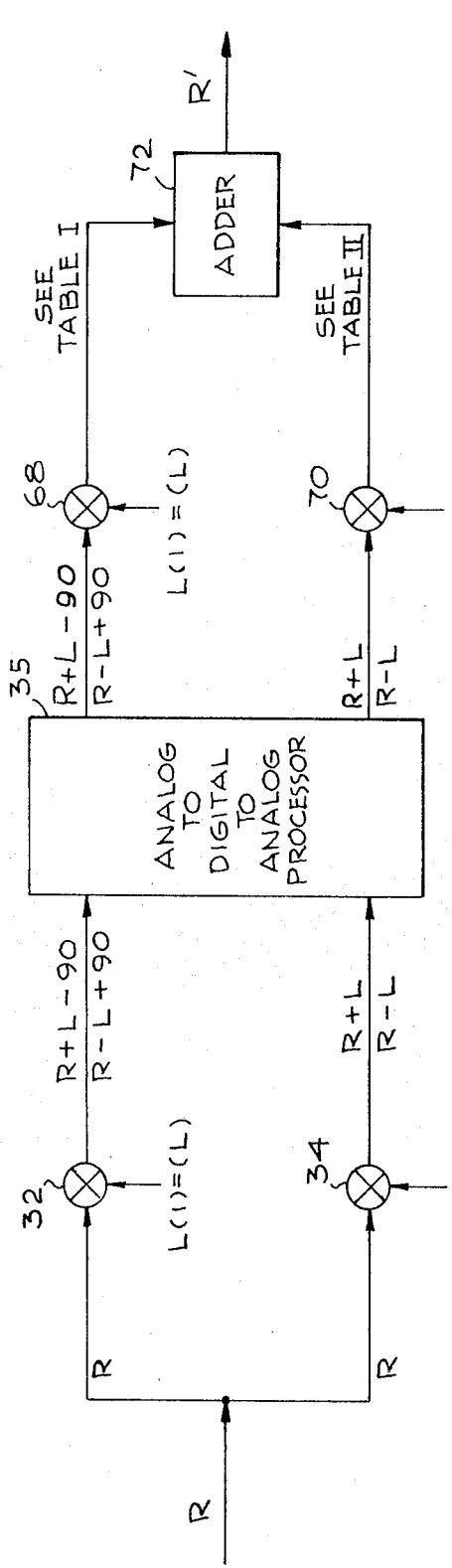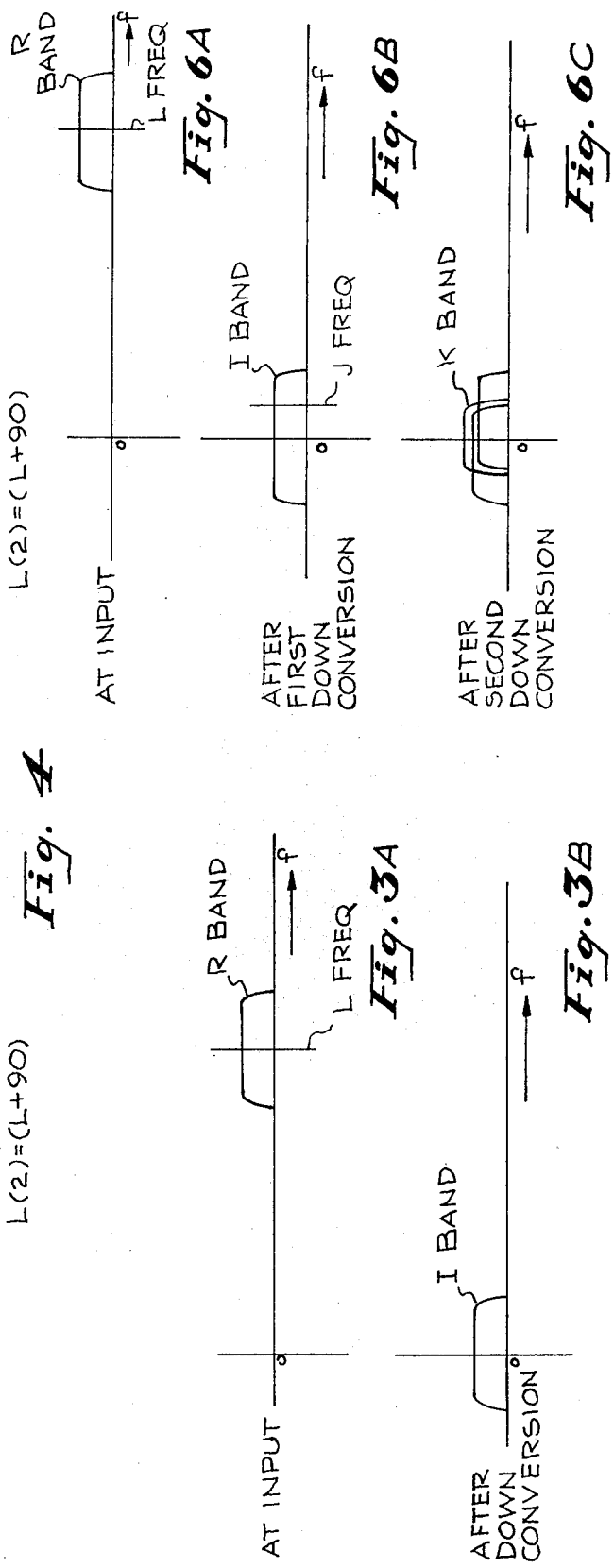

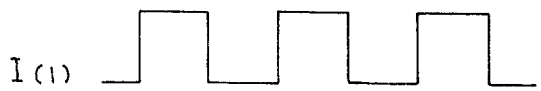
Fig. 7A
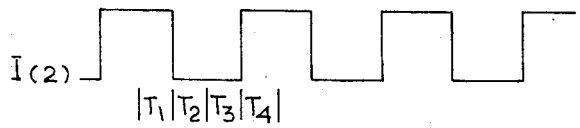
Fig. 7B
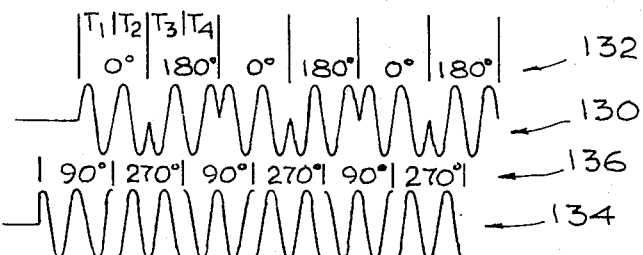
Fig. 8A
Fig. 8B
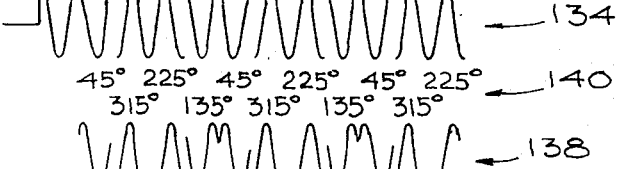
Fig. 8C
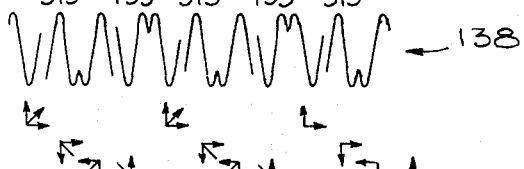
Fig. 8D
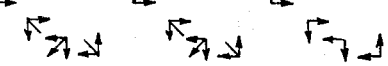
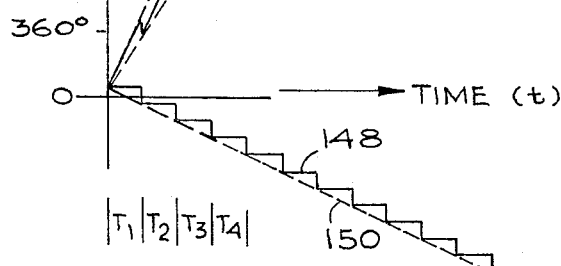
Fig. 9

3,991,409

DIGITAL STORAGE SYSTEM FOR HIGH FREQUENCY SIGNALS

CROSS-REFERENCE TO RELATED APPLICATION

This application is a continuation-in-part of copending application Ser. No. 474,245, filed May 29, 1974 for DIGITAL STORAGE SYSTEM FOR HIGH FREQUENCY SIGNALS.

BACKGROUND OF THE INVENTION

1. Field of the Invention

This invention relates to the storage and reproduction of high frequency signals and more specifically to systems and methods for the storage and accurate reproduction of pulses of microwave energy.

2. Description of the Prior Art.

In the past, storage of signals at radio frequencies, and specifically storage of pulses of microwave energy, has been shortterm storage, at best, and has been accomplished by means of various delay lines, distributed electrical parameter delay lines and recirculating delay lines. Further, this invention allows storage, not only of the average frequency of the microwave pulse, but also storage of the instantaneous frequency. Thus, microwave pulses having phase, frequency or amplitude modulation may be stored and then recovered at a later time. Storage for long, indefinite periods was not possible prior to this invention, insofar as is known. In various situations where signal analysis is desired, for example in laboratory experimentation and in electronic countermeasures systems, it is desirable to be able to store signals for long periods of time and to then be able to reproduce the original signals with accuracy and fidelity as to amplitude, frequency and phase. Magnetic recording systems are limited in their frequency capabilities to 5 to 7 MHz. Today, radiated signals in the GHz frequency range and having complex modulations are of interest but equipment for long-term storage and reproduction of such microwave signals has not been available.

SUMMARY OF THE INVENTION

It is an object of this invention to overcome the various difficulties and deficiencies which have been described hereinbefore with respect to the processing of microwave signals.

It is a more specific object of this invention to provide a system and a method for storing high frequency signals in such a fashion that they can be reproduced later with accuracy and fidelity.

It is an additional object of this invention to provide apparatus and methods for storing microwave signals digitally for later restoration to their original analog form.

According to one embodiment of the present invention the foregoing objects are met when the phase difference is determined by multiplying incoming high frequency signals by a predetermined but arbitrary number of converting signals having among them a common frequency but having differing phases. The result of the multiplication process is two sets of frequencies for each multiplying signal, one set representing the sum frequencies and the other set representing the difference frequencies. The sum frequencies are eliminated by cut-off filters or by inherent, band-limiting characteristics of the equipment in which the multiplication process is performed. The phase difference signals are then quantized using digital techniques. The number of digital bits required to represent each phase difference signal depends upon the number of parameters of the original signal which it is desired be reproduced later. For example, if only the frequency of the incoming signal needs to be reproduced and the amplitude of that incoming signal need not be produced, only two converting signal phases and only one bit representing the polarity of each of the two resulting phase difference signals are required and the magnitude of the incoming signal is ignored.

Prior to actual storage, the digital signals are quantized in time. This is accomplished by sampling the digital signals periodically at the clock rate of the digital storage or transmission system, a technique which is well known. The clock signals applied to the two sampling and storage or transmission systems may be in any phase. The best results are obtained when the clock signals have phase relationships corresponding respectively to the phases of the converting signals. Digital storage may be accomplished by any one of several well-known techniques, such as by using two shift registers. Where shift registers are used, it is often desirable to reintroduce the shift register output back into the input of the shift register so that the shifted data is not destroyed. This provides non-destructive readout of the stored signal. The process of reconstructing the original signal involves multiplying the stored digital signals, after digital-to-analog conversion (if necessary), by signals having, preferably, the frequency and phase of the original multiplying signals. The resulting product signals are summed and result in the reconstruction of the original signal.

A particularly simple arrangement in accordance with the present invention may be realized by applying single-phase conversion of the incoming microwave signals. This corresponds to a special case of N = 1, where N is the number of converting signals applied. Since only one phase is used, all hardware associated with the quadrature phase is eliminated (at a sacrifice of half the instantaneous band width). Such an arrangement provides surprisingly good results in operation, with cost savings in the conversion hardware as contrasted with a multi-phase conversion system between 60% and 80%.

Simply stated, the method according to this invention and the apparatus involved herein convert an incoming signal down in frequency by measuring its phase relative to that of a converting signal. The down-converted signal is then digitized and stored and the stored signal is later "up converted", after any required digital-to-analog conversion, by utilizing the stored signal to control the phase of the converting signals having the same frequencies and phase relationships as were involved in the "down conversion" process. Down conversion operations may be cascaded, if desired. At each such down conversion the required digital system bandwidth is reduced by one-half. At the same time, the number of digital channels required to store the information is doubled. Very convenient, long-term storage of RF signals can be achieved by following the teachings of the invention. Although the invention is generally described herein in terms of storage of microwave signals by way of example, it will be understood that the concept of the invention is applicable to any frequency signal.

BRIEF DESCRIPTION OF THE DRAWINGS

A better understanding of the invention may be had from a consideration of the following detailed description, taken in conjunction with the accompanying drawings, in which:

FIGS. 3A and 3B are diagrams showing the frequency relationship of the high frequency signal and the converting signal in embodiments of the present invention and the frequency shift resulting from conversion of the high frequency signal therein;

FIG. 4 is a block diagram showing the frequency products of down conversion and up conversion, according to the present invention;

FIGS. 6A, 6B and 6C are diagrams showing frequency relationships resulting from the system of FIG. 5;

FIGS. 7A and 7B are digital waveforms as stored in an embodiment of the invention;

FIGS. 8A–8D are diagrams illustrating phase modulation effects derived from the waveforms of FIGS. 7A and 7B;

FIG. 9 is a graph illustrating plots of phase versus time for the waveforms of FIGS. 7A–8D;

DESCRIPTION OF THE PREFERRED EMBODIMENT

Figure 1:
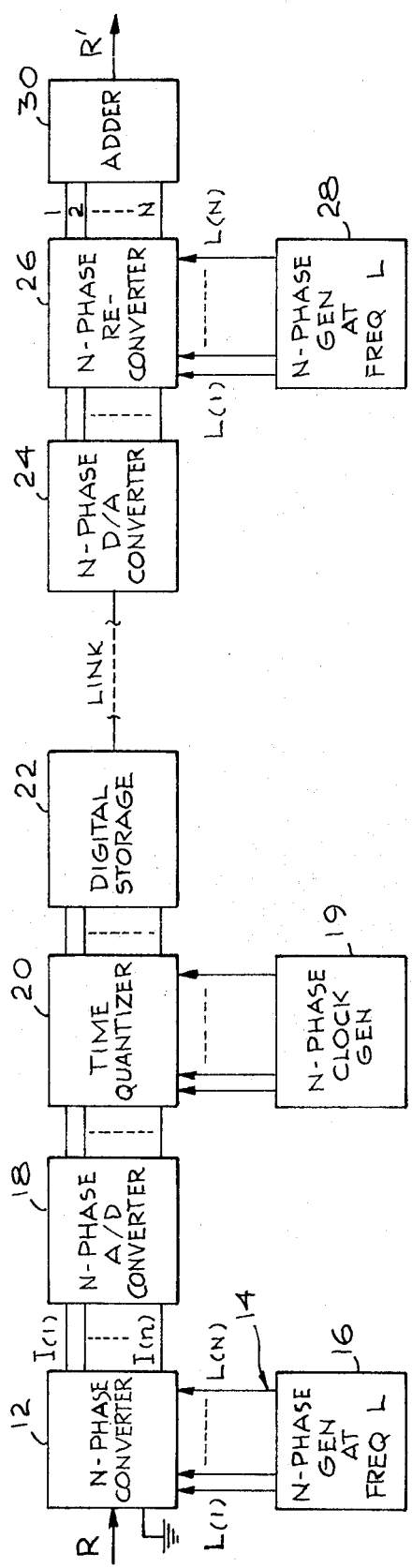
FIG. 1 is a block diagram of a generalized system in accordance with the invention for the conversion, storage and reconstruction of a high frequency signal.

In the system 10 of FIG. 1, a converter 12 receives the signal R to be stored which may include a band of frequencies. In addition, converter 12 receives a plurality of conversion signals having a frequency L with different phases from (1) to (N) from the output terminals of multi-phase, single-frequency signal generator 16. If the received signal R includes a band of frequencies, the frequency of the output signal from generator 16 is generally set at the center of that band of frequencies. The preferred sets of multiplier signals from generator 16 are those whose phases are spaced by 180°/N where N is the number of phases, although this is not an essential requirement. Thus in the preferred system, where two phases are employed, they are separated by 90°; where three phases are employed, they are separated by 60°, etc. Converter 12 performs the phase difference measurement by a multiplying process between the received signal and the conversion signals L(1) through L(N) with the result that there is a set of 2N frequencies, one half composed of the sum frequencies and the other half composed of the difference frequencies. According to this invention and at this stage in the process the sum frequencies are eliminated by well-known techniques such as frequency domain filters. When this system is operating at microwave frequencies the filtering action is often inherent in the structure of the equipment itself. The resulting phase difference signals are designated I(1) through I(N) in FIG. 1. These difference terms are then quantized as to amplitude by means of an analog-to-digital (A/D) converter 18. Such converters are well-known and may use techniques such as successive approximation and integration. The purpose of such quantizing is to convert the instantaneous amplitude levels of the difference terms into a digital representation which may be easily stored. In its simplest form the analog-to-digital converter 18 recognizes only the polarity of the incoming difference signals and ignores their magnitudes. As a result, upon reconstruction only the frequencies of incoming signal R are reproduced and the amplitude of the reconstructed signal is fixed. As more and more information is extracted from the difference signals by the converter 18, the incoming signal R is recorded with greater fidelity and consequently it can be reconstructed more precisely.

Prior to actual storage the digital signals must be quantized in time. This is accomplished in time quantizer 20. It should be noted that time quantizing is inherent in some methods of analog-to-digital conversion, but it is not inherent in the polarity sensing method utilized herein. Time quantizing is required only for convenience in operation of the digital storage or digital transmission portion of the system according to this invention. Time quantizing does simplify the digital storage which is a significant part of this invention. To time quantize the digital signals from converter 18, they are sampled periodically at the clock rate of the digital storage or transmission portion of this system, utilizing the N-phase clock generator 19. Each of the phase difference signals I(1) to I(N) is sampled in synchronism with the corresponding phases from (1) to (N) of multiphase clock frequency generator 19 producing digital signals (1) to (N).

The time quantized digital signals from quantizer 20 may be stored in the quantized time sequence in digital storage device 22, if desired, or the digital signals may be transmitted to a remote point for storage or reconstruction of the original signal R with or without time quantizing. Digital storage may be effected by any one of many well-known techniques, such as a sequential access memory or use of a shift register. Similarly a random access memory may be used if the added complexity is considered warranted.

To reconstruct the original signal R, the signals from digital storage 22 are coupled to a digital-to-analog converter 24 which performs the opposite function of the analog-to-digital converter 18. Also a reconverter 26 provides phase control of the conversion signal. In this implementation the multiple signals from converter 24 are fed to an N-phase multiplier in reconverter 26 into which N signals of phases corresponding to those derived from generator 16 and at the frequency L are fed from generator 28. The resulting signals are summed in adder 30 to produce the signal R' which is a reproduction or reconstruction of the original received signal R. It should be noted that the signals from converter 24 may be summed first and then multiplied with substantially the same results. This invention is not restricted to first multiplying and then adding during the reconstruction process.

It should also be noted that the multiplying signals used in the reconstruction process need not be of the same frequency as those multiplying signals used in the conversion process, although the relative phase relationships should be retained. When different frequencies are used, the reconstructed signal will be translated by the difference between the conversion frequency used in converter 12 and the conversion frequency used in reconverter 26 but the modulation of the original received signal R will be retained. When the multiplication is being performed during the reconstruction process, the same phase sequence should be used as was used during the conversion process; that is, if in converter 12 multiplying signal L(1) generated signal I(1) and multiplying signal L(2) generated signal I(2), and so on, in increasing sequence to N, then, on reconstruction, linear increasing phase sequences should also be used. While such one-to-one matching is desirable it is not critical. That is, if in multiplier 26 the signal corresponding to I(1) is multiplied by a signal from generator 28 which is not the same as the phase at converter 12 but is at a more advanced phase, the frequency will be correctly reconstructed but with an additional phase shift. However, if the multiplier signal at multiplier 26 is of a retarded phase so that an increasing sequence of signals from converter 24 is multiplied by a decreasing sequence of in phase multiplier signals from generator 28, the summation results in the difference of the signals from converter 24 and the multiplier frequencies, rather than the sum which is desired. This phenomenon of generating a so-called "image" frequency has some practical applications in communications systems.

Figure 1A:
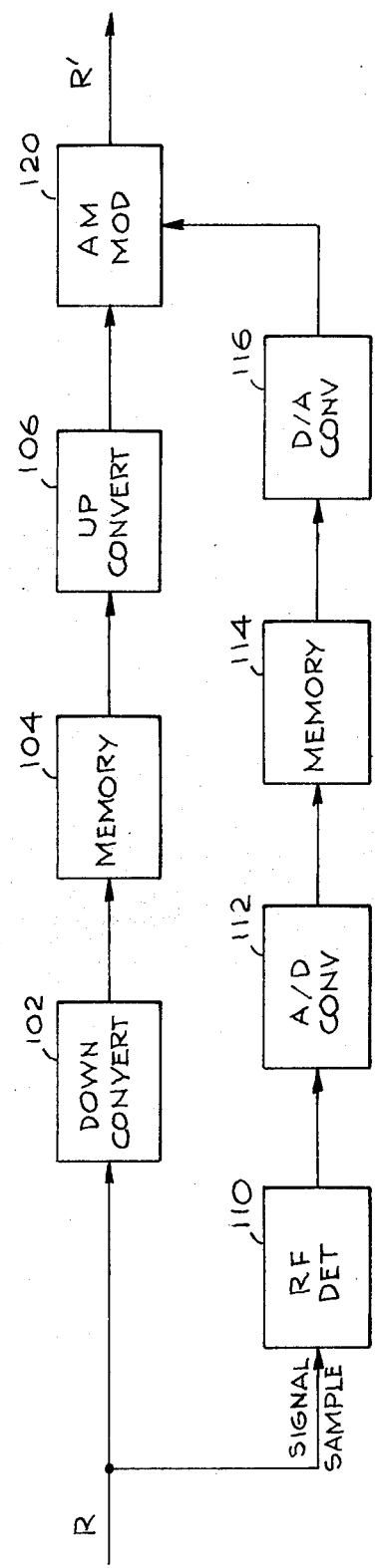
FIG. 1A is a block diagram of a further system in accordance with the invention which provides for simplified amplitude storage.

In the simplest form where the system described does not keep track of amplitude information, an additional channel may be included to provide for amplitude quantization of the input signal so that the same amplitude relationship can be included in the reconstructed signal. FIG. 1A illustrates a simplified system 100 which includes provision for preservation and reconstruction of amplitude information as well as frequency information of the input signal.

In the system depicted in FIG. 1A, the frequency processing section comprising a "down conversion" stage 102, a memory 104, and an "up conversion" stage 106 represent in general form the processing stages of the system in FIG. 1. In parallel with the frequency processing channel is an "amplitude-only" channel which includes a series of stages for quantizing the amplitude of the input signal R. These comprise an RF detector 110, an analog-to-digital converter 112, a memory 114, and a digital-to-analog converter 116. In the system 100 of FIG. 1A, a sample of the signal R is applied to the RF detector 110, the output of which is quantized by the analog-to-digital converter 112 and stored in the memory 114. When reconstruction of the signal is desired, the conversion to analog form is performed in th digital-to-analog converter 116 and the result is applied to modulate the amplitude of the upconverted signal from the stage 106 in an amplitude modulator 120. The result is the signal R' which constitutes a replication of the original input signal R, both as to amplitude and frequency, with the amplitude information having been processed in a much simpler fashion than when it is combined with the frequency information.

In this arrangement as shown in FIG. 1A, the analog-to-digital conversion in the stage 112 can be much slower than that employed in the frequency storing process, since amplitude variations of the input signal R are slow compared to the RF or even to the down-converted signal out of the stage 102. Thus, stages of less complexity and cost can be employed as the converters 112 and 116 than may be necessary in the frequency processing channel comprising the conversion stages 102 and 106.

Figure 2:
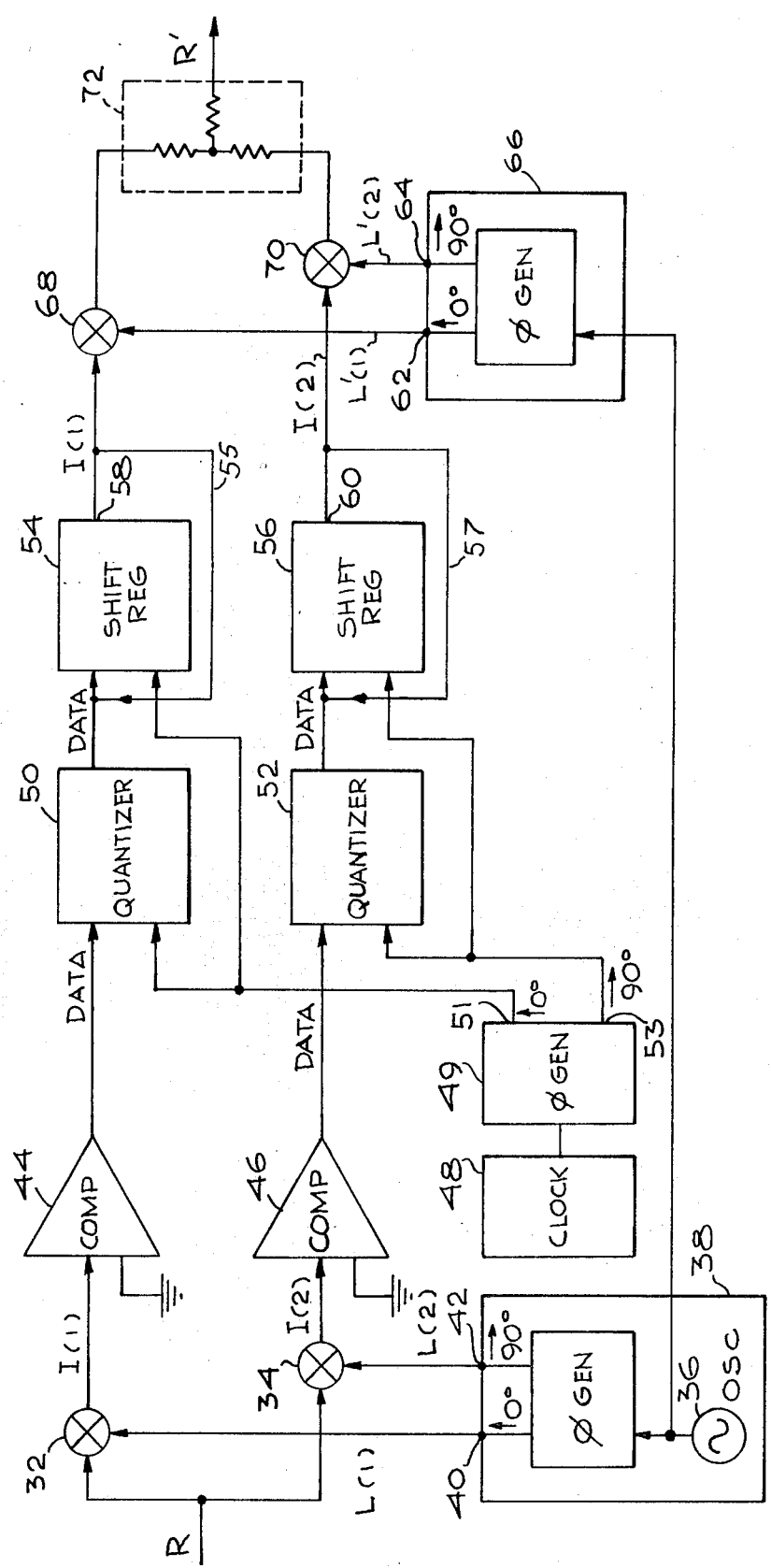
FIG. 2 is a block diagram of a more specific system in accordance with the invention, utilizing a signal having one frequency but two phases for down conversion of a high frequency signal.

In FIG. 2, input signal R which may be designated $E_0 \sin(2\pi f_r t + \phi_r)$ is fed to converter or mixer 32 and to converter or mixer 34 in separate channels. As shown in FIG. 3A, input signal R may have a band of frequencies centered about a frequency L. Oscillator 36 may have a portion of its output signal phase shifted by 90° so that phase generator 38 provides at its output terminals 40 and 42 signals L(1) and L(2) which have a 90° phase difference between them. These signals are supplied to converters or mixers 32 and 34, respectively. Difference signals I(1) and I(2) are derived from converters 32 and 34. FIG. 3B shows the theoretical position of the I signals after conversion of the R signals in mixers 32 and 34 with the band of frequencies in the incoming signal R now centered about zero frequency rather than about frequency L. The diagram would tend to indicate that there are negative frequencies but as is well-known from communications theory "fold over" occurs as far as the negative half of the spectrum is concerned and in ordinary systems this "fold over" would lead to hopeless confusion of the positive and negative frequencies. The difficulty is avoided in systems of this invention by the use of the multiphased L band signals from generator 38 to produce multiphased I band signals. The relative phases of the I band signals contain the information by which the proper signal can be reconstructed.

In the signal level analog-to-digital conversion section of FIG. 2, voltage comparators 44 and 46 are utilized. Circuits for such voltage comparators are well-known in the art and need not be described here. Signals from voltage comparator 44 and clock 48 through phase generator 49 terminal 51 are fed to quantizer 52. Phase generator 49 provides clock signals at terminals 51 and 53. Quantizers 50 and 52 may be simple flip-flops, the circuits for which are well-known to one skilled in the art. The output signals from quantizers 50 and 52 are fed as data to shift registers 54 and 56, respectively, as are also control signals from clock 48 through phase generator 49. Thus the difference signals I(1) and I(2) are converted from analog to digital form and stored. This storage may be maintained for any length of time. Other long-term or permanent memory storage mechanisms may be used if desired.

When desired, the original signal R can be reconstructed or reproduced by employing the digitized forms of phase difference signals I(1) and I(2) taken from terminals 58 and 60 of shift registers 54 and 56 to control the phase of a signal from generator 36. It is often desirable to reconstruct the high frequency signal without destroying the digital signals stored in the shift register, thus allowing the recorded signal to be reproduced as often as desired. This non-destructive read-out function is inherent in some forms of memory. When a shift register is used it can be accomplished by re-entering the data output of the shift register back to the data input as indicated by the loops 55 and 57 of shift registers 54 and 56.

In the simplified configuration of the embodiment of FIG. 2, the digital-to-analog (D/A) converter designated as number 24 in FIG. 1 is not expressly required since it is desired only that the frequency of the original signal and not its amplitude be reproduced. Oscillator 36 may be used as the source of the conversion signal, part of which is phase-shifted by 90° in generator 66, as was done in generators 38 and 49, to produce two signals L'(1) and L'(2) at the output terminals 62 and 63 of reconstruction generator 66. Converter or mixer 68 "up converts" signal I(1) and converter or mixer 70 "up converts" signal I(2). The resulting signals from converters 68 and 70 are bi-phase modulations (0, or 180°) of the quadrature signals L'(1) and L'(2) from generator 66 which are summed by an adder 72, shown as a simple resistive network, to reproduce the reconstructed original signal R'. The "up conversion" process is thus one of phase modulation and can as well be accomplished by any phase modulation mechanism, as for example a microwave diode phase shifter. This system and method have been tested and have performed very satisfactorily, indicating that the concept may be extended to more complex circuits where multiple "down conversion" may be utilized to narrow the bandwidth of the information which is to be stored digitally.

FIG. 4 together with the following Tables I and II presents an analysis of the frequencies produced during single conversion and reconstruction of signal R. In order to simplify the presentation, a notation is used in which only the argument of the sine term is used with the function being assumed. In order that the functions should not be confused, the following identity is employed in the analysis. It requires only sine terms and no cosine terms:

$$2 \; \text{Sin}(A) \; \text{Sin}(B) = [\text{Sin}(A+B-90°) + \text{Sin}(A-B+90°)]$$

The notation has been simplified even further by presenting only the phase represented by functions as follows:

$$(A)(B) = (A + B - 90) + (A - B + 90),$$

the trigonometric symbol being understood. Thus, in FIG. 4, the conversion, modulation or multiplication product of input signal R and the first conversion signal L(1) is shown to be two signals $(R + L - 90)$ and $(R - L + 90)$. The results that follow include both the sum and the difference terms. It should be observed that the results are unchanged if the sum terms, those including $R + L$, are removed as they would be by use of a frequency domain filter. This multiplication process occurs in converter 32. In converter 34 the product multiplication is shown to be $(R + L)$ and $(R - L)$ as indicated. This information is digitized and stored in the processor 35 and may be called out of storage for reconstruction, as signal R', of the original signal R as desired. The modulation or multiplication products in converter 68 are shown to have phases of $R + 2L - 180$, R, R, and $R - 2L + 180$, and the output from converter 70 during the reconstruction process is shown to be $R + 2L$, R, R, and $R - 2L$, as indicated in the following tables:

Table I

| |
|---|
| $(R + L - 90 + L - 90) +$ |
| $(R + L - 90 - L + 90) = (R + 2L - 180) + R$ |
| $(R - L + 90 + L - 90) +$ |

Table I-continued

| |
|---|
| $(R - L + 90 - L + 90) = (R - 2L + 180) + R$ |

Table II

| |
|---|
| $(R + L + L) + (R + L - L) = (R + 2L) + R$ |
| $(R - L - L) + (R - L + L) = (R - 2L) + R$ |

When the signals of Table I are summed with those of Table II, as in the adder network 72, the converting signal L drops out of the equation as does the phase angle and the result has only one component, R (represented as reconstructed signal R'). Thus the original signal has been reconstructed as far as phase (and therefore frequency) is concerned; however, with this simplified circuit exact amplitude has not been preserved. It is possible to obtain full fidelity of the reproduced signal by increasing the complexity of the analog-to-digital and digital-to-analog converters to the extent desired.

In use, the invention as described can store and reproduce frequencies within a band about the multiplier frequency L. The band of operation of the system is limited by the frequency capability of the digital storage system. When the band of the input frequencies (R) is multiplied by the fixed frequency (L), the band of difference frequencies (I) is generated. In order to make the I-band small enough to allow digital storage of the signals, L is normally placed in the center of the desired band of input frequencies R. As already explained, the usual confusion encountered in ordinary systems from the "fold over" of the frequency band including both positive and negative difference frequencies is avoided in systems in accordance with the invention by the use of the multiphase signals. The relative phase of the I signals contains the information by which the proper signal can be reconstructed.

In this way, the system need only provide a digital bandwidth of R/2 to store or transmit signals having a bandwidth of R, but at least two digital storage channels are needed, one for each phase of I, as indicated in FIG. 4. The addition of more than two phases in I, as in FIG. 1 where N is greater than 3, does not reduce the bandwidth requirements of the digital storage system. However, use of multiple phases makes possible the cancellation of certain harmonics which would otherwise cause spurious responses.

Figure 10:
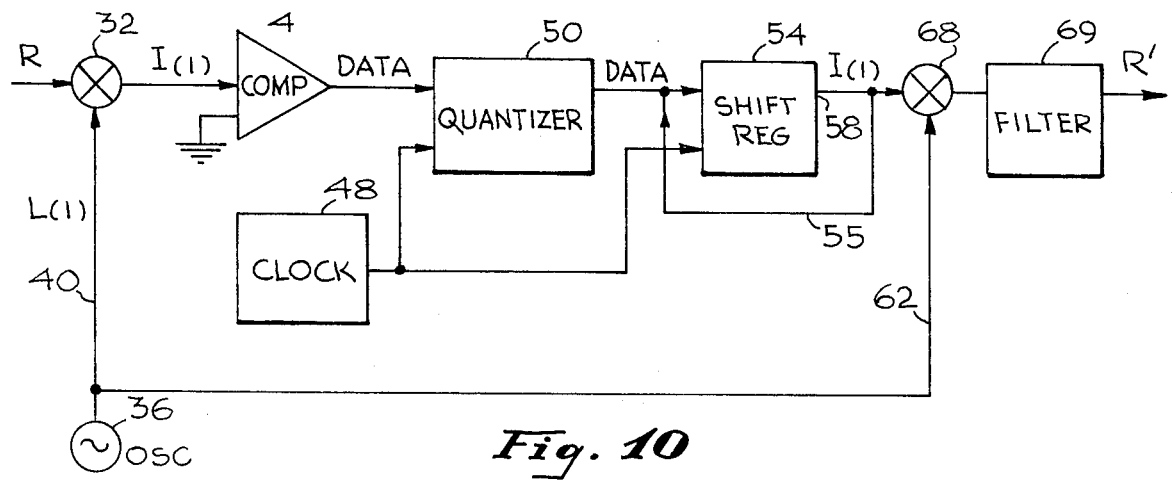
FIG. 10 is a block diagram corresponding to FIG. 2, but showing a simplified system in accordance with the invention utilizing single-phase conversion.
Figure 11:
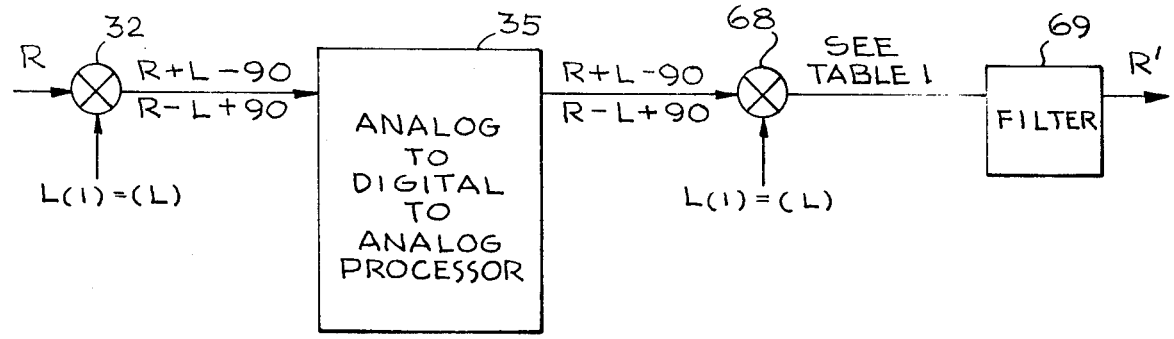
FIG. 11 is a block diagram showing the frequency products of down conversion and up conversion for the simplified arrangement of FIG. 10.

The process of harmonic cancellation indicated above is not strictly necessary in all applications. Even in those applications where such harmonics are undesirable, they may be reduced to an acceptable level by the use of frequency domain filters. Thus, where the broad bandwidth obtainable by the use of multiple phase reference signals, spectrum folding and harmonic cancellation are not required, a much simpler system can be constructed using a single reference frequency and a filter. An implementation of such a system can be derived from FIG. 1 by setting N = 1. An example of a specific implementation is shown in FIG. 10, derived from FIG. 2, in which like reference numerals are used to designate corresponding elements. Similarly, FIG. 11, derived from FIG. 4, shows the frequency products developed in the system of FIG. 10.

The simplifications obtained from the system of FIG. 2 include elimination of the oscillator phase generators 38 and 66, the clock phase generator 49, and the power combiner or adder 72, as well as one complete data channel consisting of multiplier 34, comparator 46, quantizer 52, shift register 56 and multiplier 70. A filter 69 is added at the output of the mixer 68 to avoid sideband ambiguity.

Figure 12A:
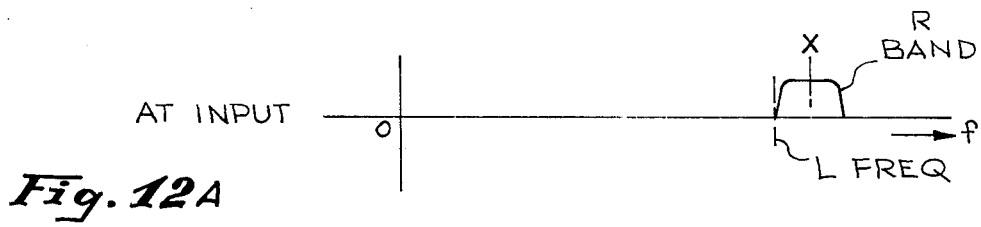
FIGS. 12A–12C are diagrams showing frequency relationships resulting from the system of FIG. 10.
Figure 12B:
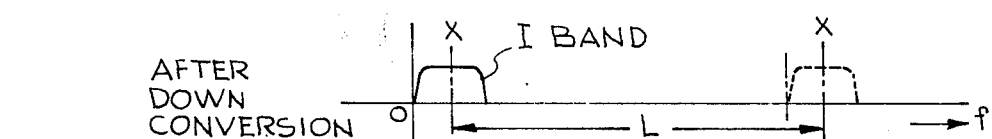

The down-conversion process in the simplified system of FIG. 10 is much the same as that previously described, except that the R band is only ½ its previous width, extending either to lower or to higher frequencies from the oscillator frequency, but not both, as is shown in FIGS. 12A and 12B. On up-conversion, the multiplication by converter 68 produces two output terms as before:

$$R - L + L - 90 = R - 90$$
$$\text{and } R - L - L + 90 = R - 2L + 90$$

Figure 12C:
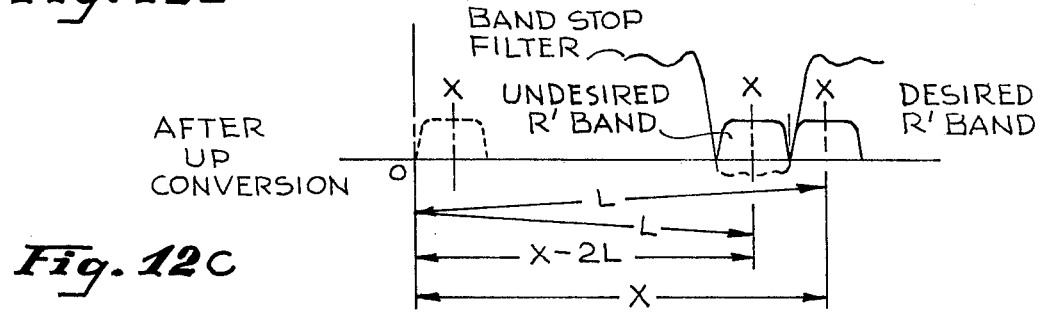

In the multiphase systems, the R − 2L + 90 term was cancelled by a corresponding term from the other channel(s); that cancellation is no longer available and, as shown in FIG. 12C, a signal appearing in spectrum R appears twice in R′. In fact, any point $x$ on the original spectrum will appear at $x$ (as well as at $x - 2L$) in the R′ spectrum, symmetrically above and below the oscillator frequency L.

The desired spectrum can be isolated by use of a filter (69 in FIGS. 10 and 11) which selectively attenuates the undesired portion of R′. In FIG. 12C, a band reject filter is shown positioned over the undesired portion of the total spectrum.

Figure 5:
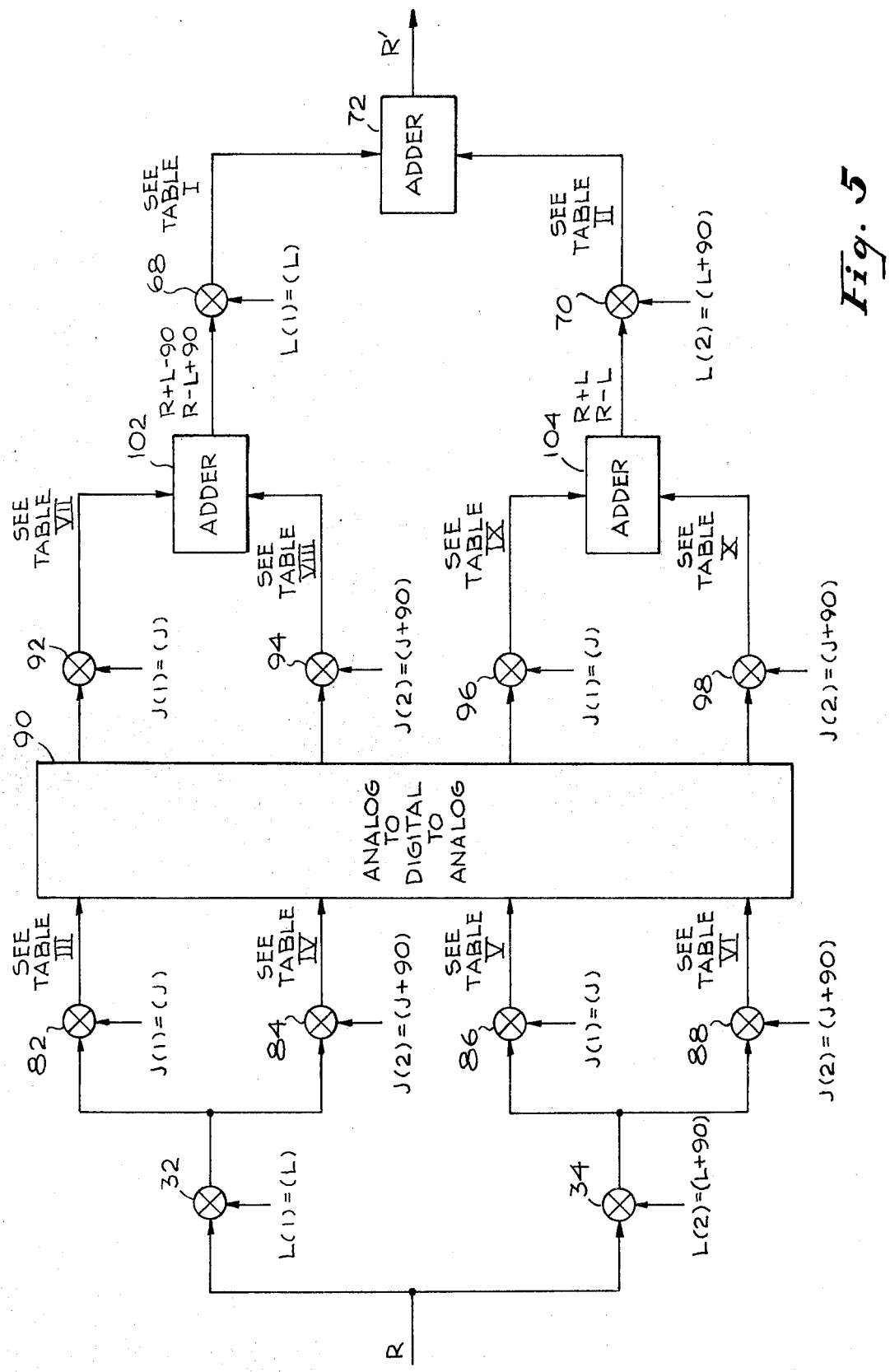
FIG. 5 is a block diagram showing a double conversion system in accordance with the invention and indicating the frequency products involved.

Moreover, it is possible to repeat the down-conversion process to reduce the digital bandwidth requirements still further. A double conversion system is shown in FIG. 5 in which the digital bandwidth requirements are reduced to R/4. In this system, the original signal R is converted into the I signals as in FIG. 4 by multiplication in mixers 32 and 34 by N-phase L-frequency signals (N = 2 in this example). However, instead of converting these I signals to digital form, they are filtered and then multiplied a second time in multipliers 82, 84, 86 and 88 by a J-frequency signal having multiple phases M. (In FIG. 5, M = 2) The J signal frequency is placed in the middle of the I signal band so that the new set of difference frequency signals K has a bandwidth of half that of I, as indicated in FIGS. 6A, 6B and 6C. Since the bandwidth of the I signals was only half that of R, the original signal band, therefore the digital system bandwidth need be only R/4 where double conversion is employed.

In FIG. 5, the K signals are processed into and out of storage in the stage 90. The reconstructed signal R′ may be developed by double conversion from the stage 90 as indicated via multipliers 92, 94, 96 and 98, combining by sets in the adder stages 102 and 104, multiplying further by the L-frequency signals in the single conversion mixers 68 and 70 corresponding to FIG. 4, and finally combining in the adder 72. As indicated in FIG. 5, the K signals resulting from the multiplication by J frequency signals in stages 82, 84, 86 and 88 are shown respectively in the following Tables III, IV, V and VI. Again the sum terms are shown in the Tables, but they may be removed by time domain filtering without changing the result. Such double conversion may also be realized for the N = 1 system of FIG. 10 by similarly limiting the arrangement of FIG. 5 to single J frequency and L frequency reference signals and incorporating the appropriate band reject filters.

Table III

R + L + J − 180
R + L − J
R − L + J
R − L − J + 180

Table IV

R + L + J − 90
R + L − J − 90
R − L + J + 90
R − L − J + 90

Table V

R + L + J − 90
R + L − J + 90
R − L + J − 90
R − L − J + 90

Table VI

R + L + J
R + L − J
R − L + J
R − L − J

Each of the difference terms in Tables III, IV, V and VI contains both an R-L part and a J part. Either of these may be either positive or negative and hence one of the difference terms will be less than J and the other greater than J. Bandwidth reduction is achieved when the larger of the terms is removed by a time domain filter near frequency J.

In the signal reconstruction process, the signals out of the mixers 92, 94, 96 and 98 are as indicated in the following Tables VII, VIII, IX and X:

Table VII

| | | | |
|---|---|---|---|
| R + L + J − 180 | − J + 90 | = R + L | − 90 |
| R + L + J − 180 | + J − 90 | = R + L + 2J | − 270 |
| R + L − J | − J + 90 | = R + L − 2J | + 90 |
| R + L − J | + J − 90 | = R + L | − 90 |
| R − L + J | − J + 90 | = R − L | + 90 |
| R − L + J | + J − 90 | = R − L + 2J | − 90 |
| R − L − J + 180 | − J + 90 | = R − L − 2J | + 270 |
| R − L − J + 180 | + J − 90 | = R − L | + 90 |

Table VIII

| | | |
|---|---|---|
| R + L + J − 90 + J | = R + L + 2J | − 90 |
| R + L + J − 90 − J | = R + L | − 90 |
| R + L − J − 90 + J | = R + L | − 90 |
| R + L − J − 90 − J | = R + L − 2J | − 90 |
| R − L + J + 90 + J | = R − L + 2J | + 90 |
| R − L + J + 90 − J | = R − L | + 90 |
| R − L − J + 90 + J | = R − L | + 90 |
| R − L − J + 90 − J | = R − L − 2J | + 90 |

Table IX

| | |
|---|---|
| R + L + J − 90 + J − 90 | = R + L + 2J − 180 |
| R + L + J − 90 − J + 90 | = R + L |
| R + L − J + 90 + J − 90 | = R + L |
| R + L − J + 90 − J + 90 | = R + L − 2J + 180 |
| R − L + J − 90 + J − 90 | = R − L + 2J − 180 |
| R − L + J − 90 − J + 90 | = R − L |
| R − L − J + 90 + J − 90 | = R − L |

Table IX-continued

R − L − J + 90 − J − 90 = R − L − 2J + 180

Table X

| | | |
|---|---|---|
| R + L + J | + J | = R + L + 2J |
| R + L + J | − J | = R + L |
| R + L − J | + J | = R + L |
| R + L − J | − J | = R + L − 2J |
| R − L + J | + J | = R − L + 2J |
| R − L + J | − J | = R − L |
| R − L − J | + J | = R − L |
| R − L − J | − J | = R − L − 2J |

There appears to be no reason why additional orders of conversion may not be employed to permit even wider frequency range application. At each step, the number of digital storage channels is doubled but the digital bandwidth of the channels is reduced by two. Alternatively, if the RF bandwidth is doubled, the digital bandwidth equals its original value.

As indicated in FIG. 5, the reconstruction process involves multiplying the stored signals from the stage 90 (now containing NM phases) by an M-phase J-frequency signal, J(M). In the summing process in adders 102, 104, the terms containing the frequencies J(M) cancel one another and an N-phase I-frequency signal, I(N), results. This signal is then multiplied by an N-phase set of L signals. The results are summed and the desired reconstructed signal R' results.

Mention has already been made of the capability of arrangements in accordance with the present invention to use signals from the digital storage section for modulating the phase of the multi-phase analog frequency signals from the signal generator employed in the conversion process. This capability may be explained in the case of a simplified version by reference to the embodiment shown in FIG. 2 and a consideration of FIGS. 7A–9.

The system of FIG. 2 is concerned with two difference signals I(1) and I(2). These signals as derived from the shift registers 54, 56 at the respective output terminals 58, 60 are illustrated in FIGS. 7A and 7B, respectively. It will be noted that the two signals are in phase quadrature with each other and, for convenience in reference, a single cycle has been divided into four 90° segments designated $T_1$, $T_2$, $T_3$, and $T_4$ respectively. The waveform I(1) (FIG. 7A) may be considered either in phase (0°) or 180° out of phase with an arbitrary reference. The signal I(2) is therefore either at 90° or 270° phase with the same reference. The I(1) waveform is mixed in the converter 68 with a zero degrees analog waveform at the frequency of the oscillator 36, which signal is shown as L'(1) at the terminal 62 of FIG. 2. The resultant output of the converter 68 is the waveform 130 of FIG. 8A and the 0°/180° phase sequence is indicated at 132.

Similarly the waveform I(2) is mixed in the converter 70 with the 90°-phase analog waveform L'(2) at terminal 64. This results in a waveform 134 of FIG. 8B at the output of the converter 70. The series 136 indicates the relative phase of the waveform 134 of FIG. 8B. After combination in the summing circuit 72, the waveform 138 having the relative phases indicated by the series 140 as shown in FIG. 8C is developed as the replicated signal R' at the output of the stage 72. The miniature vector diagrams of FIG. 8D, representing the phases of the series 140 (FIG. 8C), illustrate the result of the phase modulation by the signals I(1) and I(2) in vector presentation form.

The results are shown in graphical form in FIG. 9, which is a plot of phase as a function of time. Since the slope of any line on such a plot is the derivative of the dependent variable taken with respect to the independent variable (in this case, $D\phi/dt$) and since $\phi = 2\pi ft$, it may be seen that $d\phi/dt = 2\pi f$.

In FIG. 9, the zigzag line 142 represents the instantaneous frequency of R' at the output of the stage 72. In any given interval, $T_1$, $T_2$, etc., the slope of the line 142, represented by the broken line 144, corresponds to the frequency of oscillator 36. The overall slope of the zigzag line 142, represented by the broken line 146, corresponds to the frequency of the signal R. The successive vectors of FIG. 8D are represented by the stair-step waveform 148 of FIG. 9. The overall slope of the waveform 148, represented by the broken line 150, corresponds to the frequency of the I signals. It will be understood that the phase modulation capabilities hereinabove explained for the arrangement of the invention as shown in FIG. 2 are also present in other, more complex arrangements in accordance with the invention.

There has thus been provided, by means of this invention, a method of and a system for converting received signals, on which may be imposed various forms of amplitude, frequency or phase modulation, to a set of digital signals for the purpose of storage or transmission in digital form, and for reconstructing the original signal from the stored digital data.

Although there have been described hereinabove specific arrangements of a digital storage system for high frequency signals in accordance with the invention for the purpose of illustrating the manner in which the invention may be used to advantage, it will be appreciated that the invention is not limited thereto. Accordingly, any and all modifications, variations or equivalent arrangements which may occur to those skilled in the art should be considered to be within the scope of the invention.

What is claimed is:

1. A storage and reconstruction system for high frequency signals, including:
    a first signal converter adapted for the coupling thereto of high frequency signals to be stored;
    a reference signal source coupled to the first signal converter for providing a reference signal for mixing with the high frequency signals;
    processing means coupled to the first signal converter for transforming certain of the output signals therefrom to digital signals;
    storage means for storing the digital signals from the processing means; and
    reconstruction means coupled to the storage means for reproducing high frequency signals from the stored digital signals.

2. A system in accordance with claim 1 wherein the reconstruction means includes a second signal converter and means coupled to the second signal converter for supplying thereto a reference signal of frequency identical to the signal from the reference signal source.

3. A system in accordance with claim 2 wherein the last-mentioned means comprises an electrical coupling between the reference signal source and the second signal converter.

4. A system in accordance with claim 1 further including filtering means coupled to the output of the second converter for selectively discriminating between different frequency components of the reconstructed high frequency signals at said output.

5. A system in accordance with claim 4 wherein the filtering means comprises a band reject filter tuned to reject undesired portions of the signal spectrum at said output.

6. A system in accordance with claim 1 further including additional signal converting means coupled in series with the first and second signal converters respectively, the additional signal converting means being driven at common reference signal frequency which is different from the reference signal frequency of the first reference signal source in order to develop double conversion of the high frequency signals.

7. Apparatus according to claim 1 in which said reconstruction means includes a digital-to-analog converter coupled to the storage means.

8. A system in accordance with claim 1 wherein the storage means includes means for maintaining the storage of the digital signals following the read-out thereof for the reproduction of the high frequency signals.

9. The method of storing high frequency signals for an indefinite period which includes the steps of:
combining the high frequency signals with a single reference signal having a frequency positioned centrally within the spectrum of the signals to be stored;
digitizing the difference frequency signals resulting from said combining step;
storing the digitized difference frequency signals; and
reconstructing the high frequency signals from the digitally stored difference frequency signals.

10. The method of claim 9 in which the reconstructing step includes the steps of:
converting said digitally stored signals to representative analog signals;
combining said analog signals with a reference signal having a frequency corresponding to said centrally positioned frequency; and
filtering the output of the analog signal combining step to eliminate unwanted frequency components thereof.

11. The method of processing high frequency signals which includes the steps of:
determining the phase differences of the high frequency signals relative to a single reference signal;
digitizing the phase differences;
processing the resulting digital signals;
converting the processed signals to analog signals; and
reconstructing the high frequency signals by combining the analog signals with a single reference signal identical to the aforementioned single reference signal.

* * * * *